(12) United States Patent
Nakano et al.

(10) Patent No.: US 10,868,404 B2
(45) Date of Patent: Dec. 15, 2020

(54) LASER LIGHT SOURCE DEVICE AND METHOD OF MANUFACTURING LASER LIGHT SOURCE DEVICE

(71) Applicant: Mitsubishi Electric Corporation, Tokyo (JP)

(72) Inventors: Seiji Nakano, Tokyo (JP); Toshihide Seki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/776,549

(22) PCT Filed: Feb. 22, 2016

(86) PCT No.: PCT/JP2016/055030
§ 371 (c)(1),
(2) Date: May 16, 2018

(87) PCT Pub. No.: WO2017/145229
PCT Pub. Date: Aug. 31, 2017

(65) Prior Publication Data
US 2018/0331495 A1   Nov. 15, 2018

(51) Int. Cl.
*H01S 5/022* (2006.01)
*G02B 27/09* (2006.01)
(Continued)

(52) U.S. Cl.
CPC ...... *H01S 5/02288* (2013.01); *G02B 19/0028* (2013.01); *G02B 19/0057* (2013.01);
(Continued)

(58) Field of Classification Search
CPC ............... H01S 5/02288; H01S 5/0071; H01S 5/02292; H01S 5/02; H01S 5/005;
(Continued)

(56) References Cited

U.S. PATENT DOCUMENTS 5,557,475 A * 9/1996 Nightingale ........... G02B 27/09
359/333
5,808,803 A * 9/1998 Ullmann ............... G02B 6/4249
359/641
(Continued)

FOREIGN PATENT DOCUMENTS

DE   102014213406 A1   1/2016
EP      0102221 A2   3/1984
(Continued)

OTHER PUBLICATIONS

International Search Report for PCT/JP2016/055030 (PCT/ISA/210) dated May 10, 2016.
(Continued)

*Primary Examiner* — Joshua King
(74) *Attorney, Agent, or Firm* — Birch, Stewart, Kolasch & Birch, LLP

(57) ABSTRACT

A technology disclosed in the specification of the subject application relates to a laser light source device capable of suppressing loss of optical output power from a semiconductor laser device, and to a method of manufacturing of a laser light source device while the degree of freedom in arrangement of the semiconductor laser device is secured. A laser light source device according to the subject technology includes a semiconductor laser device, and an optical element provided on an optical axis of an emission light emitted from the semiconductor laser device. The optical element separates a portion of a luminous flux of an emission light that is emitted from the semiconductor laser device and that is not separated in a fast axis direction from another portion so as to be separated in the fast axis direction.

10 Claims, 4 Drawing Sheets

(51) Int. Cl.
  *G02B 19/00* (2006.01)
  *H01S 5/00* (2006.01)
  *H01S 5/40* (2006.01)
  *G03B 21/20* (2006.01)

(52) U.S. Cl.
  CPC ..... *G02B 27/0905* (2013.01); *G02B 27/0972* (2013.01); *H01S 5/0071* (2013.01); *H01S 5/02236* (2013.01); *H01S 5/02292* (2013.01); *G03B 21/208* (2013.01); *G03B 21/2033* (2013.01); *H01S 5/02276* (2013.01); *H01S 5/4031* (2013.01)

(58) Field of Classification Search
  CPC ............ G02B 19/0028; G02B 27/0905; G02B 27/0972; G02B 27/0916–0922; G02B 27/095–0983; G03B 21/208; G03B 21/2033
  See application file for complete search history.

(56) References Cited

U.S. PATENT DOCUMENTS

| | | | | |
|---|---|---|---|---|
| 5,825,551 | A * | 10/1998 | Clarkson | B23K 26/0604 359/629 |
| 5,926,320 | A * | 7/1999 | Parkyn, Jr. | F21S 41/322 359/641 |
| 6,181,476 | B1 * | 1/2001 | Medvedev | G02B 3/02 359/618 |
| 2003/0026002 | A1 * | 2/2003 | Lopez-Hernandez | G02B 5/0278 359/641 |
| 2004/0146083 | A1 * | 7/2004 | Ehlers | G02B 27/0977 372/108 |
| 2005/0063436 | A1 * | 3/2005 | Nishimura | G02B 27/0927 372/43.01 |
| 2006/0209912 | A1 * | 9/2006 | Luo | G02F 1/3534 372/21 |
| 2010/0226655 | A1 * | 9/2010 | Kim | G02B 6/4246 398/139 |
| 2011/0057204 | A1 * | 3/2011 | Morioka | G02B 6/4214 257/84 |
| 2011/0069968 | A1 * | 3/2011 | Tanaka | G02B 6/29362 398/140 |
| 2012/0019909 | A1 * | 1/2012 | Xiao | G02B 27/285 359/489.08 |
| 2012/0127715 | A1 * | 5/2012 | Ariga | G02B 27/108 362/235 |
| 2014/0119017 | A1 * | 5/2014 | Wu | G02B 5/0808 362/259 |
| 2015/0168737 | A1 * | 6/2015 | Yang | G02B 27/283 359/489.08 |
| 2015/0219890 | A1 * | 8/2015 | Kumeta | H01S 5/0071 359/226.1 |
| 2015/0229106 | A1 | 8/2015 | Yabe | |
| 2016/0025298 | A1 * | 1/2016 | Reitterer | H01S 5/4087 362/231 |
| 2017/0170625 | A1 | 6/2017 | Halbritter et al. | |
| 2017/0176758 | A1 * | 6/2017 | Lerner | G02B 27/0927 |
| 2017/0371111 | A1 * | 12/2017 | Morioka | G02B 6/4214 |

FOREIGN PATENT DOCUMENTS

| | | | | |
|---|---|---|---|---|
| EP | 1830443 | A1 | 9/2007 | |
| JP | 50-37465 | B2 | 4/1975 | |
| JP | 02213189 | A * | 8/1990 | |
| JP | 2002-140830 | A | 5/2002 | |
| JP | 2004-103792 | A | 4/2004 | |
| JP | 2011-215495 | A | 10/2011 | |
| JP | 2015-153840 | A | 8/2015 | |
| WO | WO-2005015701 | A1 * | 2/2005 | ............ G02B 26/00 |
| WO | WO-2016067617 | A2 * | 5/2016 | ........... G02B 6/4271 |
| WO | WO-2017031138 | A1 * | 2/2017 | ................ F21V 9/30 |
| WO | WO-2017138649 | A1 * | 8/2017 | ........... H01S 5/0206 |

OTHER PUBLICATIONS

Office Action for Canadian Application No. 3,013,292, dated Jun. 3, 2019.

* cited by examiner

LASER LIGHT SOURCE DEVICE AND METHOD OF MANUFACTURING LASER LIGHT SOURCE DEVICE

TECHNICAL FIELD

A technology disclosed in the specification of the subject application relates to a laser light source device including a semiconductor laser device and to a method of manufacturing a laser light source device including a semiconductor laser device, for example.

BACKGROUND ART

As a light source included in a display device such as a projector, a light source using a halogen lamp or a metal halide lamp is used. However, in recent years, a laser light source having the features of long life, low power consumption, high luminance, and high color purity has been actively applied to a display device.

An optical device used in digital cinema or the like, such as a large-size projector, enhances its output power by increasing the number of installed laser light sources in order to obtain required optical output power. However, such increase in the number of installed laser light sources involves generation of disadvantages of increase in the size of the device and also increase in costs. Accordingly, enhancement of optical output power in a laser light source itself, or reduction in component costs, is demanded.

Further, in order to project emission light from a plurality of laser light sources onto an optical device such as a projector, the emission light needs to be substantially collimated by a microlens or the like in the laser light source itself.

In view of the above, as a structure of enhancing optical output power in a laser light source itself and substantially collimating an emission light, for example, a structure as illustrated in Patent Document 1 is disclosed. In the structure of Patent Document 1, a semiconductor laser device having a plurality of light emitting points, i.e., a multi-emitter semiconductor laser device, is installed, and further, an emission light of the multi-emitter semiconductor laser device is substantially collimated using a microlens.

PRIOR ART DOCUMENT

Patent Document

Patent Document 1: Japanese Patent Application Laid-Open No. 2015-153840

SUMMARY

Problem to be Solved by the Invention

In order to substantially collimate an emission light form a semiconductor laser device, a microlens needs to be arranged on an optical axis.

However, in a case where a semiconductor laser device and a microlens are mounted coplanarly on a substrate such as a stem, a lower half component in a fast axis direction (y-axis direction) of an emission light impinges upon a substrate for supporting a semiconductor laser, such as a stem, because a divergence angle of the emission light of the semiconductor laser device is large. In this case, optical output power is lost.

Therefore, for example, in a structure illustrated in Patent Document 1, a semiconductor laser device is arranged on a stem with an intermediation of a supporting member such as a block or a sub-mount, and further, a microlens for substantially collimating an emission light is arranged on a side surface of the block. Such arrangement realizes a structure allowing all emission light beams to be projected into the microlens so as to be substantially collimated.

In such a structure, arrangement of the semiconductor laser device needs to be adjusted in order to prevent loss of optical output power from the semiconductor laser device. Therefore, the degree of freedom in arrangement of the semiconductor laser device is hindered.

A technology disclosed in the specification of the subject application has been made in order to solve the problems as described above, and relates to a laser light source device capable of suppressing loss of optical output power from a semiconductor laser device, and to a method of manufacturing of a laser light source device while the degree of freedom in arrangement of the semiconductor laser device is secured.

Means to Solve the Problem

One aspect of a technology disclosed in the specification of the subject application includes a semiconductor laser device, and an optical element provided on an optical axis of an emission light that is emitted from the semiconductor laser device. The optical element separates a portion of a luminous flux of the emission light that is emitted from the semiconductor laser device and that is not separated in a fast axis direction from another portion so as to be separated in the fast axis direction.

Further, another aspect of a technology disclosed in the specification of the subject application includes preparing a semiconductor laser device, providing an optical element on an optical axis of an emission light that is emitted from the semiconductor laser device, separating, with use of the optical element, a portion of a luminous flux of the emission light that is emitted from the semiconductor laser device and that is not separated in a fast axis direction from another portion so as to be separated in the fast axis direction, making the optical element have a structure in which lens parts are combined together, the lens parts being obtained by dividing one lens into two along an optical axis direction of the semiconductor laser device and a direction orthogonal to the optical axis direction of the semiconductor laser device, defining, as a first a lens part, one of the lens parts arranged on a side closer to the semiconductor laser device before the division, defining, as a second lens part and a third lens part, the lens parts arranged on a side farther from the semiconductor laser device before the division, processing a surface of the first lens part that extends along the optical axis of the semiconductor laser device into a first inclined surface that is inclined with respect to the optical axis of the semiconductor laser device, processing a portion of a surface of the second lens part that extends along the optical axis of the semiconductor laser device and that is formed by the division into a second inclined surface that is parallel to the first inclined surface, arranging the first lens part at a position where the first inclined surface approaches closer to the optical axis of the semiconductor laser device as the first inclined surface is more distant from the semiconductor laser device, arranging the third lens part, on the optical axis of the semiconductor laser device, at a position more distant from the semiconductor laser device than the first lens part, and arranging the second lens part at a position where a surface of the third lens part that extends along the optical axis of the semiconductor laser device and that is opposite to a surface formed by the division and a surface of the second lens part that extends along the optical axis of the semiconductor laser device and that is opposite to a surface formed by the division are brought adjacent to each other.

Effects of the Invention

One aspect of the technology disclosed in the specification of the subject application includes a semiconductor laser device, and an optical element provided on an optical axis of an emission light that is emitted from the semiconductor laser device, in which the optical element separates a portion of a luminous flux of the emission light that is emitted from the semiconductor laser device and that is not separated in a fast axis direction from another portion so as to be separated in the fast axis direction. According to such a configuration, loss of optical output power from a semiconductor laser device can be suppressed while the degree of freedom in arrangement of the semiconductor laser device is secured.

Further, another aspect of the technology disclosed in the specification of the subject application includes preparing a semiconductor laser device, providing an optical element on an optical axis of an emission light that is emitted from the semiconductor laser device, separating, with use of the optical element, a portion of a luminous flux of the emission light that is emitted from the semiconductor laser device and that is not separated in a fast axis direction from another portion so as to be separated in the fast axis direction, making the optical element have a structure in which lens parts are combined together, the lens parts being obtained by dividing one lens into two along an optical axis direction of the semiconductor laser device and a direction orthogonal to the optical axis direction of the semiconductor laser device, defining, as a first a lens part, one of the lens parts arranged on a side closer to the semiconductor laser device before the division, defining, as a second lens part and a third lens part, the lens parts arranged on a side farther from the semiconductor laser device before the division, processing a surface of the first lens part that extends along the optical axis of the semiconductor laser device into a first inclined surface that is inclined with respect to the optical axis of the semiconductor laser device, processing a portion of a surface of the second lens part that extends along the optical axis of the semiconductor laser device and that is formed by the division into a second inclined surface that is parallel to the first inclined surface, arranging the first lens part at a position where the first inclined surface approaches closer to the optical axis of the semiconductor laser device as the first inclined surface is more distant from the semiconductor laser device, arranging the third lens part, on the optical axis of the semiconductor laser device, at a position more distant from the semiconductor laser device than the first lens part, and arranging the second lens part at a position where a surface of the third lens part that extends along the optical axis of the semiconductor laser device and that is opposite to a surface formed by the division and a surface of the second lens part that extends along the optical axis of the semiconductor laser device and that is opposite to a surface formed by the division are brought adjacent to each other. According to such a configuration, loss of optical output power from a semiconductor laser device can be suppressed while the degree of freedom in arrangement of the semiconductor laser device is secured.

An object, features, aspects, and advantages relating to the technology disclosed in the specification of the subject application become more obvious with the following detailed description and the attached drawings.

DESCRIPTION OF EMBODIMENT

Now, description is given of an embodiment with reference to the attached drawings.

Note that, the drawings are schematically illustrated, and an interrelationship between the size and the position of an image illustrated in each different drawing is not necessarily illustrated to be accurate but is changeable as appropriate.

Further, in the description illustrated below, similar components are denoted by the same reference symbols in illustration, and the term and the function thereof are assumed to be similar as well. Accordingly, detailed description of such components may be omitted.

Further, in the description given below, even in a case where terms denoting particular positions and directions, such as "up," "down," "side," "bottom," "front," and "back," are used, such terms are used for the convenience sake to facilitate understanding of details of the embodiment, and are not related to directions in actual implementation.

Embodiment

Now, description is given of a laser light source device and a method of manufacturing a laser light source device according to this embodiment.

Configuration of Laser Light Source Device

Figure 1:
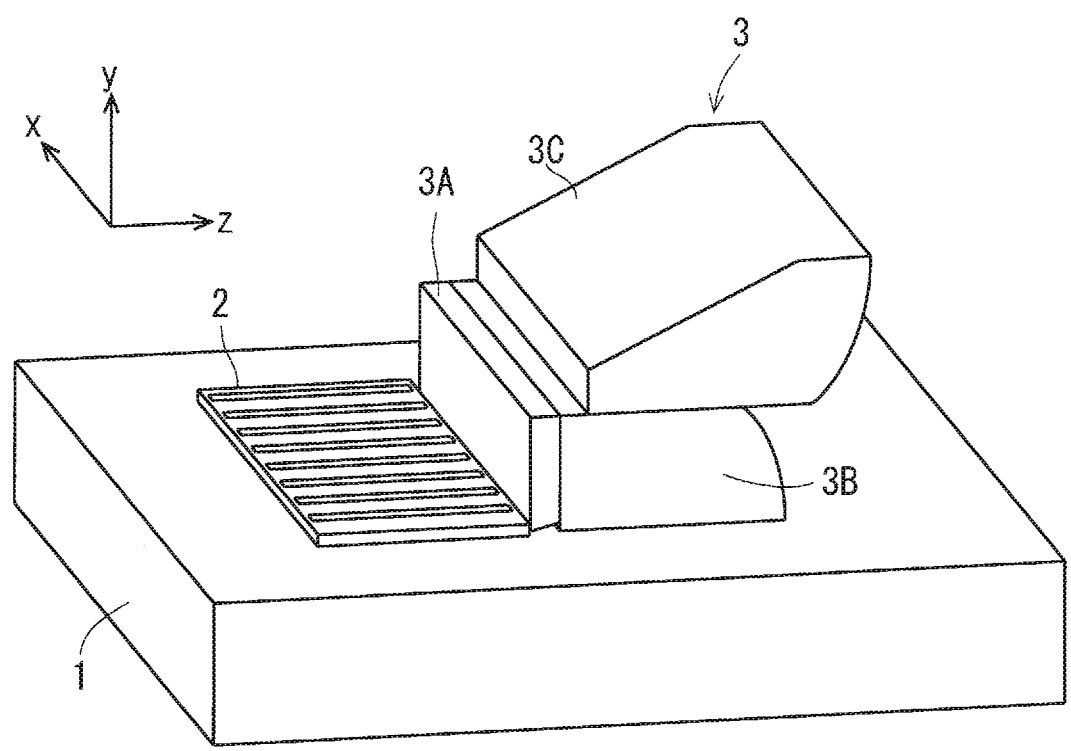
FIG. 1 is a view schematically illustrating a configuration for implementing a laser light source device according to an embodiment.

FIG. 1 is a view schematically illustrating a configuration for implementing a laser light source device according to this embodiment. As illustrated in FIG. 1, the laser light source device includes a stem 1, a semiconductor laser device 2 that is mounted to the stem 1 and that has at least one light emitting point, and an optical element 3 that is mounted to the stem 1 and that substantially collimates an emission light of the semiconductor laser device 2.

The stem 1 is formed into a plate-like shape, and is, for example, a stem base of a metallic material obtained by depositing Au plating and a metallized pattern on a surface of a highly thermally conductive material such as Cu. The stem 1 has a role of fixing the semiconductor laser device 2 and the optical element 3, and of dissipating heat generated in the semiconductor laser device 2 to a cooling member (herein not shown) below the stem 1.

The semiconductor laser device 2 is, for example, a laser diode in which at least one light emitting point is arranged on an end surface of a semiconductor chip containing GaAs, AlGaN, or the like. From each light emitting point in the semiconductor laser device 2, a laser light is emitted along an optical axis that is perpendicular to the chip end surface and that is parallel to a chip main surface.

The optical element 3 includes a microlens 3A, a microlens 3B, and a microlens 3C. The optical element 3 has a function of substantially collimating a laser light. Further, the optical element 3 may have a function of a prism.

The optical element 3 is arranged on an optical axis of an emission light emitted from the semiconductor laser device 2. Further, the optical element 3 separates a portion of a luminous flux of an emission light that is emitted from the semiconductor laser device 2 and that is not separated in a fast axis direction from another portion so as to be separated in the fast axis direction. As a method of separation, for example, reflection and refraction are assumable.

In joining of the stem 1 and the semiconductor laser device 2, for example, AuSn solder excellent in reliability and thermal conductivity is used as solder to be used at the time of the joining.

Figure 2:
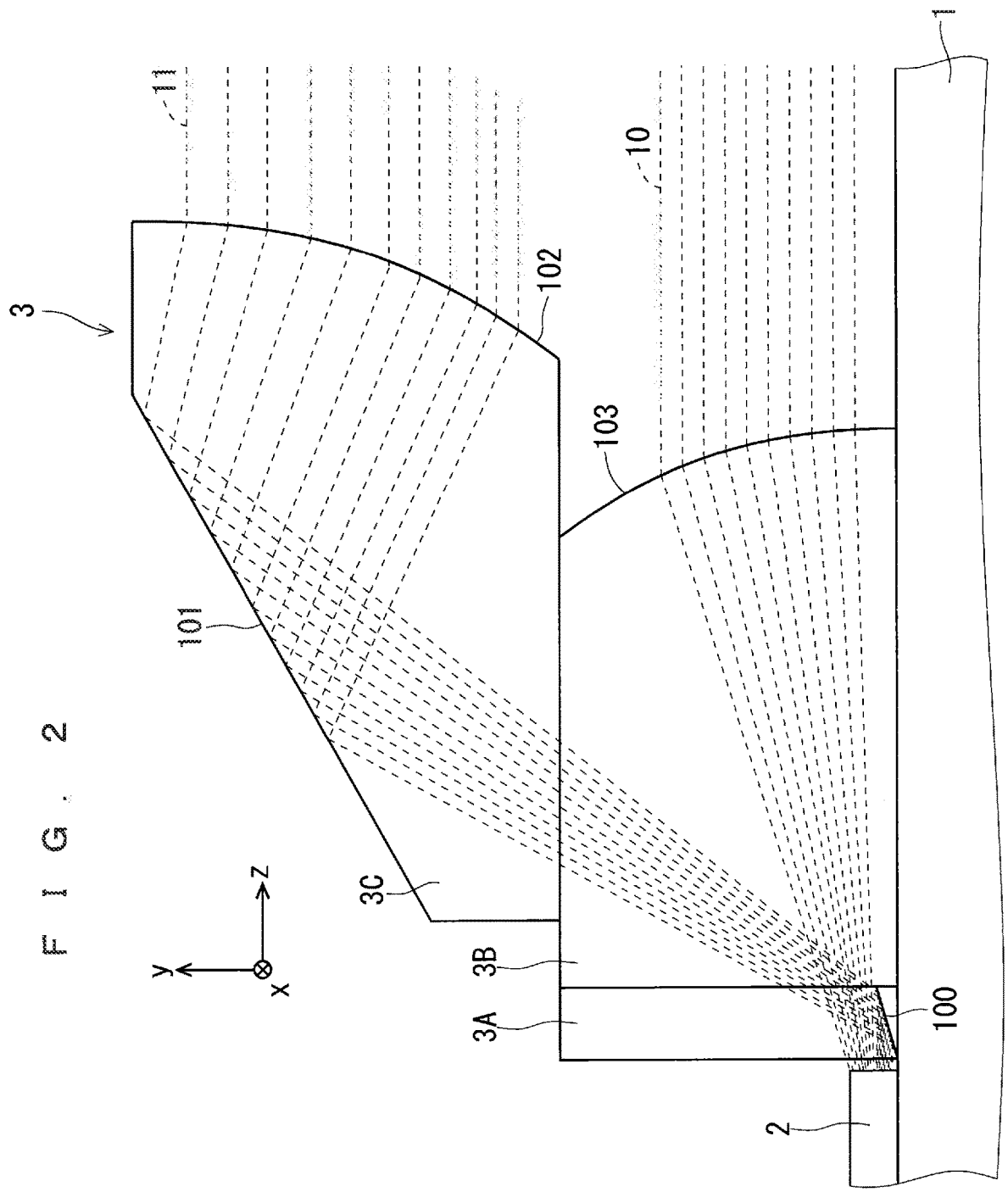
FIG. 2 is a view illustrating optical paths of an emission light in a fast axis direction of the laser light source device according to the embodiment.

FIG. 2 is a view illustrating optical paths of an emission light in the fast axis direction of the laser light source device.

In the fast axis direction, a divergence angle (total angle) of an emission light from the semiconductor laser device 2 is approximately 80°. Therefore, usually, in a case where the semiconductor laser device 2 is directly mounted to the stem 1, a lower-half component of an emission light impinges upon the stem 1 to lose its optical output power.

However, as illustrated in FIG. 2, the laser light source device according to this embodiment includes the microlens 3A having a trapezoidal shape in the vicinity of a light emitting point of the semiconductor laser device 2. Owing to such a structure, a lower-half component of an emission light from the semiconductor laser device 2 in a fast axis direction being a vertical direction of FIG. 2, i.e., an emission light 11, is reflected by a reflection surface 100 of the trapezoidal microlens 3A toward a side opposite to the direction in which the stem 1 is arranged. In other words, the emission light 11 that has a component diverging toward the stem 1 side is converted into a light that has a component diverging toward a side opposite to the stem 1 side.

Here, the reflection surface 100 is such an inclined surface to approach closer to the optical axis of the semiconductor laser device 2 as the surface is more distant from the semiconductor laser device 2. The reflection surface 100 illustrated in FIG. 2 comes in contact with the stem 1 on its end portion on a side closer to the semiconductor laser device 2. Further, the reflection surface 100 is out of contact with the stem 1 on its end portion on a side farther from the semiconductor laser device 2.

Further, the microlens 3B provided on an upper surface of the stem 1 and the microlens 3C provided on an upper surface of the microlens 3B are arranged behind the optical paths of the trapezoidal microlens 3A. Owing to such a structure, the emission light 11 reflected on the reflection surface 100 is further reflected on a reflection surface 101 of the microlens 3C, and is then substantially collimated by an optical effect surface 102 of the microlens 3C for substantially collimating light. Here, the reflection surface 101 is a surface parallel to the reflection surface 100.

Such reflection of an emission light as described above enables suppression of light loss due to impingement of the emission light upon the stem 1, and thus extractable substantially collimated light can be increased.

Note that, an upper-half component of an emission light from the semiconductor laser device 2 in the fast axis direction, i.e., an emission light 10, is substantially collimated by an optical effect surface 103 of the microlens 3B for substantially collimating light.

Owing to such a structure, even in a case where the semiconductor laser device 2 and an optical element such as a microlens are arranged coplanarly, loss of optical output power of an emission light can be suppressed and extractable substantially collimated light can be increased.

Figure 3:
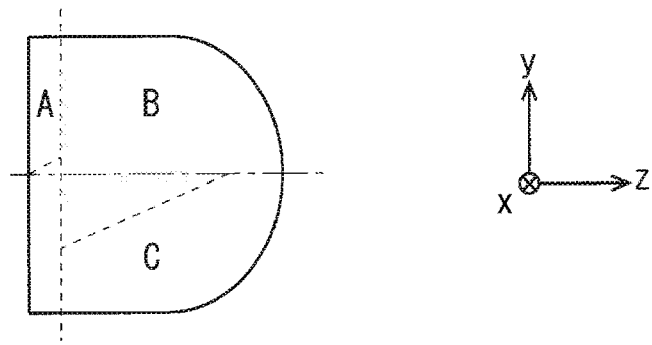
FIG. 3 is a view illustrating a configuration of an optical element according to the embodiment.
Figure 4:
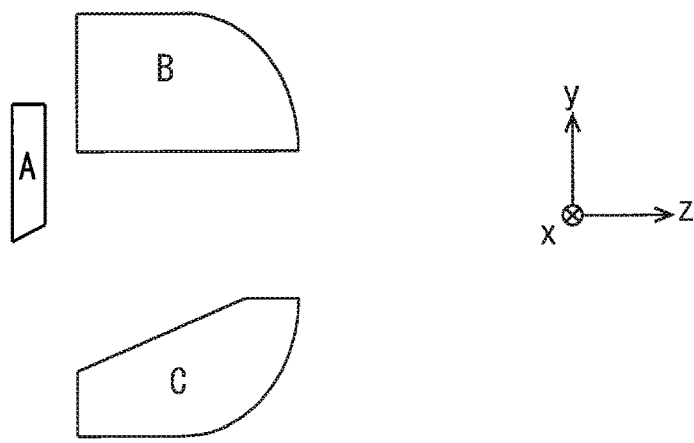
FIG. 4 is a view illustrating a configuration of the optical element according to the embodiment.
Figure 5:
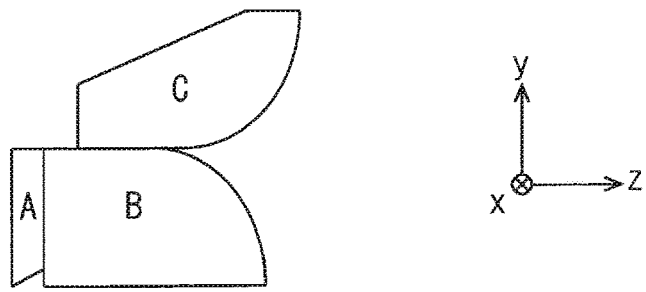
FIG. 5 is a view illustrating a configuration of the optical element according to the embodiment.

FIG. 3, FIG. 4, and FIG. 5 are each a view illustrating a configuration of the optical element 3. With reference to FIG. 3, FIG. 4, and FIG. 5, description is given of a configuration of the optical element 3 obtained by combining together the microlens 3A, the microlens 3B, and the microlens 3C that are illustrated in FIG. 1 and FIG. 2.

For example, as illustrated in FIG. 3, one microlens is cut at the positions of the dotted lines. Specifically, one microlens is divided into two along an optical axis direction of the semiconductor laser device 2 (z-axis direction) and a direction orthogonal to the optical axis direction of the semiconductor laser device 2 (y-axis direction in FIG. 3). Further, a surface of a part A that extends along the optical axis of the semiconductor laser device 2 is cut so as to have inclination with respect to the optical axis of the semiconductor laser device 2. With this, the reflection surface 100 is formed. Then, a portion of a surface of a part C that extends along the optical axis of the semiconductor laser device 2 and that is formed by the division is cut so as to have inclination with respect to the optical axis of the semiconductor laser device 2. With this, the reflection surface 101 is formed. Then, as illustrated in FIG. 4, the cut part A, part B, and part C are separated apart.

Further, as illustrated in FIG. 5, the cut part A, part B, and part C are combined together, thus enabling construction of the optical element 3. Specifically, the part A is arranged at a position where the reflection surface 100 approaches closer to the optical axis of the semiconductor laser device 2 as the reflection surface 100 is more distant from the semiconductor laser device 2. Then, the part B is arranged, on the optical axis of the semiconductor laser device 2, at a position more distant from the semiconductor laser device 2 than the part A. Then, the part C is arranged at a position where a surface of the part B that extends along the optical axis of the semiconductor laser device 2 and that is opposite to the surface formed by the division and a surface of the part C that extends along the optical axis of the semiconductor laser device 2 and that is opposite to the surface formed by the division are brought adjacent to each other.

According to such a method, the number of microlenses used to manufacture the optical element 3 suffices to be one, and hence component costs can be reduced.

Further, as for bonding at the time of combining together the microlens 3A, the microlens 3B, and the microlens 3C, for example, an epoxy-based adhesive may be used. In a case of using an epoxy-based resin, joining may be carried out by temporarily curing a resin with ultraviolet light irradiation immediately after bonding, and then by curing the resin with heat through heat treatment.

Note that, a sub-mount 4 may be mounted between the stem 1 and the semiconductor laser device 2 as necessary. In general, a sub-mount has an electric insulation function and a heat conduction function.

Figure 6:
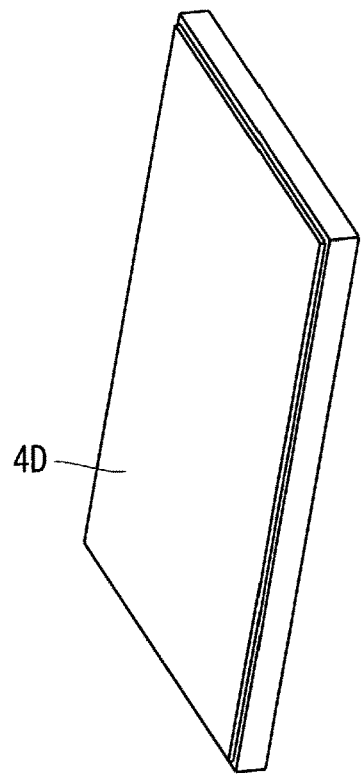
FIG. 6 is a view illustrating a structure of a sub-mount according to the embodiment.
Figure 7:
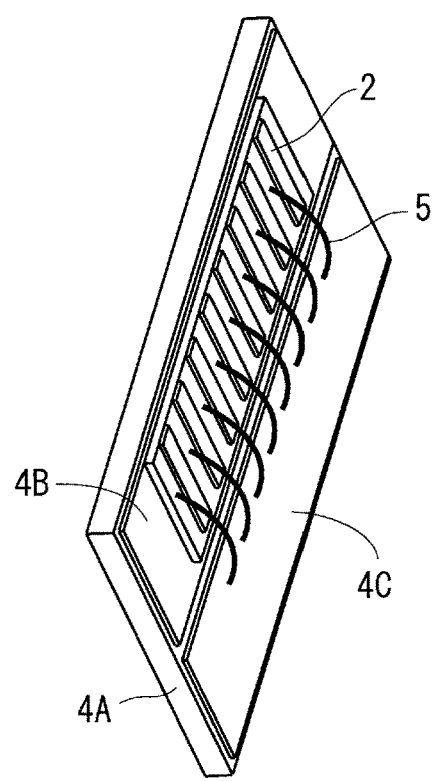
FIG. 7 is a view illustrating a structure of the sub-mount according to the embodiment.

FIG. 6 and FIG. 7 are each a view illustrating a structure of the sub-mount 4. As illustrated in FIG. 6 and FIG. 7, the sub-mount 4 has an electrical insulator 4A having a flat plate-like shape, a plurality of metallized patterns 4B and metallized patterns 4C that are formed in a surface of the electrical insulator 4A, and a metallized pattern 4D that is formed across an entire back surface of the electrical insulator 4A. As the electrical insulator 4A, for example, SiC, AlN, or the like, which has high thermal conductivity, is used.

Further, the metallized pattern 4B and the semiconductor laser device 2 in the sub-mount 4 are joined using solder. The metallized pattern 4C of the sub-mount 4 and a drive electrode of each semiconductor laser device 2 are electrically connected through contact bonding with ultrasonic vibration, for example, using an electrically conductive wire 5 such as Au.

Note that, the metallized pattern 4D is formed not for the purpose of power supply. The metallized pattern 4D is provided for the purpose of suppressing deflection of the sub-mount that may be generated due to difference between a linear expansion coefficient of the electrical insulator 4A and a linear expansion coefficient of the metallized pattern 4B, or due to difference between a linear expansion coefficient of the electrical insulator 4A and a linear expansion coefficient of the metallized pattern 4C.

When the sub-mount 4 is mounted, a mounting surface of the semiconductor laser device 2 and a mounting surface of the optical element 3 are no longer coplanar. However, in a case where a mounting surface of the sub-mount 4 and a mounting surface of the optical element 3 are coplanar, the thickness of the sub-mount 4 is, for example, 300 μm or more and 600 μm or less. From the above, in order to substantially collimate all emission light beams in the fast axis direction of the semiconductor laser device 2, a structure as the optical element 3 needs to be provided after all.

Effects Generated by Embodiment Described Above

Now, effects generated by the embodiment described above are illustrated. Note that, such effects are described below based on specific configurations illustrated in the embodiment described above. However, another specific configuration illustrated in the specification of the subject application may substitute as long as similar effects are generated.

According to the embodiment described above, the laser light source device includes the semiconductor laser device 2 and the optical element 3. Further, the optical element 3 is provided on an optical axis of an emission light emitted from the semiconductor laser device 2. Further, the optical element 3 separates a portion of a luminous flux of an emission light that is emitted from the semiconductor laser device 2 and that is not separated in the fast axis direction from another portion so as to be separated in the fast axis direction.

According to such a configuration, in a case where loss of optical output power may be generated due to impingement of, upon an obstruction or the like, a portion of a luminous flux of an emission light emitted from the semiconductor laser device 2, for example, generation of such loss of optical output power due to impingement upon an obstruction or the like can be suppressed by, for example, separating the emission light in the fast axis direction from another portion. Further, arrangement of the semiconductor laser device need not be adjusted, and therefore the degree of freedom in arrangement of the semiconductor laser device can be secured.

Note that, other configurations illustrated in the specification of the subject application excluding the configurations above may be omitted as appropriate. That is, the effects described above can be generated only with the configurations above.

However, also in a case where at least one of other configurations illustrated in the specification of the subject application is added to the configurations described above as appropriate, that is, also in a case where other configurations omitted as the configurations described above but illustrated in the specification of the subject application are added to the configurations described above, the effects described above can be similarly generated.

Further, according to the embodiment described above, an emission light emitted from the semiconductor laser device has a component diverging in the fast axis direction. Here, a light that is contained in an emission light from the semiconductor laser device 2 and that has a component diverging in a first direction within the fast axis direction is defined as a first emission light. Further, a light that is contained in an emission light from the semiconductor laser device 2 and that has a component diverging in a second direction being a direction opposite to the first direction within the fast axis direction is defined as a second emission light. Here, the emission light 11 corresponds to the first emission light. Further, the emission light 10 corresponds to the second emission light. Further, the optical element 3 converts the emission light 11 into a light that has a component diverging in the second direction within the fast axis direction. According to such a configuration, the emission light 11 that has a component diverging in the first direction, which is contained in an emission light that is emitted from the semiconductor laser device 2 and that has a component diverging in the fast axis direction, can be converted into a light that has a component diverging in the second direction opposite to the first direction. Accordingly, generation of loss of optical output power due to impingement of the emission light 11 upon an obstruction present in the first direction can be suppressed.

Further, according to the embodiment described above, the optical element 3 emits light beams parallel to each other by refracting the emission light 10 and the converted emission light 11. According to such a configuration, an emission light that is emitted from the semiconductor laser device 2 and that has a component diverging in the fast axis direction can be converted into light beams parallel to each other to be emitted.

Further, according to the embodiment described above, the optical element 3 has such an inclined surface as to approach closer to the optical axis of the semiconductor laser device 2 as the surface is more distant from the semiconductor laser device 2. Here, the reflection surface 100 corresponds to the inclined surface. According to such a configuration, the emission light 11 that has a component diverging toward the stem 1 side can be reflected toward a side opposite to the stem 1 side. Accordingly, generation of loss of optical output power due to impingement of the emission light 11 upon the stem 1 can be suppressed.

Further, according to the embodiment described above, the laser light source device includes a flat plate-like flat plate member. Here, the stem 1 corresponds to the flat plate member. Further, the optical element 3 is provided on an upper surface of the stem 1. The emission light 11 is a light that is contained in an emission light from the semiconductor laser device 2 and that has a component diverging toward the stem 1 side in the fast axis direction. Further, the emission light 10 is a light that is contained in an emission light from the semiconductor laser device 2 and that has a component diverging toward a side opposite to the stem 1 side in the fast axis direction. Further, the optical element 3 converts the emission light 11 into a light that has a component diverging toward a side opposite to the stem 1 side with respect to the optical axis. According to such a configuration, the emission light 11 that has a component diverging toward the stem 1 side, which is contained in an emission light that is emitted from the semiconductor laser device 2 and that has a component diverging in the fast axis direction, can be converted into a light that has a component diverging toward a side opposite to the stem 1 side. Accordingly, generation of loss of optical output power due to impingement of the emission light 11 upon the stem 1 can be suppressed.

Further, according to the embodiment described above, the optical element 3 reflects the emission light 11 toward a side opposite to the stem 1 side. According to such a configuration, the emission light 11 that has a component diverging toward the stem 1 side, which is contained in an emission light that is emitted from the semiconductor laser device 2 and that has a component diverging in the fast axis direction, can be reflected toward a side opposite to the stem 1 side. Accordingly, generation of loss of optical output power due to impingement of the emission light 11 upon the stem 1 can be suppressed.

Further, according to the embodiment described above, the semiconductor laser device 2 is provided on an upper surface of the stem 1. According to such a configuration, loss of optical output power from the semiconductor laser device 2 can be suppressed without the necessity of a member for supporting the semiconductor laser device 2, such as a block or a sub-mount. Specifically, even in a case where the semiconductor laser device 2 and the optical element 3 are arranged coplanarly, loss of a light that has a component diverging toward the stem 1 side in the fast axis direction of the semiconductor laser device 2 can be suppressed. Further, the number of components for constructing the device is not increased, and therefore manufacturing costs can be reduced. Further, the manufacturing process can be simplified. Further, in a case where a cooling device or the like is arranged on a lower surface of the stem 1 to thereby cool the semiconductor laser device 2, thermal resistance until the reach to the semiconductor laser device 2 can be reduced. Therefore, optical output power characteristics can be enhanced. Further, reliability of the device can be maintained.

Further, according to the embodiment described above, the laser light source device includes the sub-mount 4 provided on an upper surface of the stem 1. Further, the semiconductor laser device 2 is provided on an upper surface of the sub-mount 4. According to such a configuration, such a case can also be assumed where a mounting surface of the semiconductor laser device 2 and a mounting surface of the optical element 3 are not coplanar. Further, even in a case of such a structure, generation of loss of optical output power due to impingement upon an obstruction or the like can be suppressed, for example, because an emission light emitted from the semiconductor laser device 2 is appropriately separated in the fast axis direction by the optical element 3. Further, the thickness of the sub-mount 4 can be assumed to be, for example, 300 μm or more and 600 μm or less, and hence heat dissipation of the semiconductor laser device 2 can be maintained.

Further, according to the embodiment described above, the optical element 3 has a structure in which lenses decomposed from one lens are combined together. According to such a configuration, the number of microlenses used to manufacture the optical element 3 suffices to be one, and hence component costs can be reduced.

Further, according to the embodiment described above, the optical element 3 has a function of substantially collimating a laser light, or a function of a prism. According to such a configuration, an emission light that is emitted from the semiconductor laser device 2 and that has a component diverging in the fast axis direction can be converted into light beams parallel to each other to be emitted.

Further, according to the embodiment described above, in the method of manufacturing a laser light source device, the semiconductor laser device 2 is prepared. Then, the optical element 3 is provided on the optical axis of an emission light emitted from the semiconductor laser device 2. Here, the optical element 3 separates a portion of a luminous flux of an emission light that is emitted from the semiconductor laser device 2 and that is not separated in the fast axis direction from another portion so as to be separated in the fast axis direction. Further, the optical element 3 has a structure in which lens parts obtained by dividing one lens into two along an optical axis direction of the semiconductor laser device 2 and a direction orthogonal to the optical axis direction of the semiconductor laser device 2 are combined together. Here, one of the lens parts arranged on a side closer to the semiconductor laser device 2 before the division is defined as a first lens part. Further, the lens parts arranged on a side farther from the semiconductor laser device 2 before the division are defined as a second lens part and a third lens part. Note that, the part A corresponds to the first lens part. Further, the part B corresponds to the third lens part. Further, the part C corresponds to the second lens part. Further, a surface of the part A that extends along the optical axis of the semiconductor laser device 2 is processed into a first inclined surface that is inclined with respect to the optical axis of the semiconductor laser device 2. Note that, the reflection surface 100 corresponds to the first inclined surface. Then, a portion of a surface of the part C that extends along the optical axis of the semiconductor laser device 2 and that is formed by the division is processed into a second inclined surface that is parallel to the reflection surface 100. Note that, the reflection surface 101 corresponds to the second inclined surface. Then, the part A is arranged at a position where the reflection surface 100 approaches closer to the optical axis of the semiconductor laser device 2 as the reflection surface 100 is more distant from the semiconductor laser device 2. Then, the part B is arranged, on the optical axis of the semiconductor laser device 2, at a position more distant from the semiconductor laser device 2 than the part A. Then, the part C is arranged at a position where a surface of the part B that extends along the optical axis of the semiconductor laser device 2 and that is opposite to the surface formed by the division and a surface of the part C that extends along the optical axis of the semiconductor laser device 2 and that is opposite to the surface formed by the division are brought adjacent to each other.

According to such a configuration, loss of optical output power from the semiconductor laser device 2 can be suppressed while the degree of freedom in arrangement of the semiconductor laser device 2 is secured. Further, the number of microlenses used to manufacture the optical element 3 suffices to be one, and hence component costs can be reduced.

Note that, other configurations illustrated in the specification of the subject application excluding the configurations above may be omitted as appropriate. That is, the effects described above can be generated only with the configurations above.

However, also in a case where at least one of other configurations illustrated in the specification of the subject application is added to the configurations described above as appropriate, that is, also in a case where other configurations omitted as the configurations described above but illustrated in the specification of the subject application are added to the configurations described above, the effects described above can be similarly generated.

Further, unless special limitation is imposed, the order of implementing each processing may be changed.

Modified Example in Embodiment Described Above

In the embodiment described above, material quality, a material, dimensions, a shape, a relative arrangement relationship, a condition for implementation, or the like of each component may also be described, which however are in all aspects illustrative and are not to be limited to such described in the specification of the subject application.

Accordingly, unillustrated numerous modified examples are assumable within the scope of the technology disclosed in the specification of the subject application. For example, the case of modifying at least one component, the case of adding at least one component, or the case of omitting at least one component is encompassed.

Further, unless there arises a contradiction, concerning a component whose number to be provided has been described to be "one" in the embodiment described above, "one or more" of the components may be provided.

Further, each component is a conceptual unit. A case where one component is made of a plurality of structural objects, a case where one component corresponds to a part of a certain structural object, and a case where a plurality of components are provided in one structural object are encompassed.

Further, as long as the same function is exhibited, each component encompasses a structural object having another structure or shape.

Further, the description in the specification of the subject application is to be referred to for the sake of every object relating to the subject technology, any of which is not to be acknowledged as a conventional technology.

Further, in the embodiment described above, in a case where a material name or the like is described without particular specification, a material obtained by adding another additive to the material, such as an alloy, for example, is encompassed unless there arises a contradiction.

EXPLANATION OF REFERENCE SIGNS 1 stem, 2 semiconductor laser device, 3 optical element, 3A, 3B, 3C microlens, 4 sub-mount, 4A electrical insulator, 4B, 4C, 4D metallized pattern, 5 electrically conductive wire, 10, 11 emission light, 100, 101 reflection surface, 102, 103 optical effect surface, A, B, C part

The invention claimed is:
1. A laser light source device comprising: a semiconductor laser device mounted on the substrate, the semiconductor laser device emitting an emission light having a divergence angle greater than zero such that the emitted light has a lower-half component light which diverges in a direction towards the substrate and an upper-half component light which diverges in a direction away from the substrate; and an optical element provided on the optical axis of an emission light that is emitted from the semiconductor laser device, the semiconductor laser device and the optical element are provided coplanarly on the substrate, wherein the optical element defines, out of a luminous flux of the emission light emitted from the semiconductor laser device and that is not separated in a fast axis direction, the lower-half component light diverging in toward the substrate within the fast axis direction as a first emission light, and the upper-half component light diverging in away from the substrate, within the fast axis direction as a second emission light, the optical element includes a first lens that converts the first emission light received from the semiconductor laser device which diverges toward the substrate into a light that has a component diverging in a direction which is away from the substrate within the fast axis direction producing converted emission light, and the optical element emits light beams parallel to each other by refracting the second emission light and the converted emission light.

2. The laser light source device according to claim 1, wherein the first lens has such an inclined surface as to approach closer to the optical axis of the semiconductor laser device as the inclined surface is more distant from the semiconductor laser device.

3. The laser light source device according to claim 1, wherein
the optical element has a structure in which lens parts are combined together, the lens parts being obtained by dividing one first lens into two along an optical axis direction of the semiconductor laser device and a direction orthogonal to the optical axis direction of the semiconductor laser device,
one of the lens parts arranged on a side closer to the semiconductor laser device before the division is defined as a first lens part,
the lens parts arranged on a side farther from the semiconductor laser device before the division are defined as a second lens part and a third lens part,
a surface of the first lens part that extends along the optical axis of the semiconductor laser device is processed into a first inclined surface that is inclined with respect to the optical axis of the semiconductor laser device,
a portion of a surface of the second lens part that extends along the optical axis of the semiconductor laser device and that is formed by the division is processed into a second inclined surface that is parallel to the first inclined surface,
the first lens part is arranged at a position where the first inclined surface approaches closer to the optical axis of the semiconductor laser device as the first inclined surface is more distant from the semiconductor laser device,
the third lens part is arranged, on the optical axis of the semiconductor laser device, at a position more distant from the semiconductor laser device than the first lens part, and
the second lens part is arranged at a position where a surface of the third lens part that extends along the optical axis of the semiconductor laser device and that is opposite to a surface formed by the division and a surface of the second lens part that extends along the optical axis of the semiconductor laser device and that is opposite to a surface formed by the division are brought adjacent to each other.

4. The laser light source device according to claim 1, wherein the optical element has a function of substantially collimating a laser light or a function of a prism.

5. The laser light source device according to claim 2, wherein
the optical element has a structure in which lens parts are combined together, the lens parts being obtained by dividing the first lens into two along an optical axis direction of the semiconductor laser device and a direction orthogonal to the optical axis direction of the semiconductor laser device,
one of the lens parts arranged on a side closer to the semiconductor laser device before the division is defined as a first lens part,
the lens parts arranged on a side farther from the semiconductor laser device before the division are defined as a second lens part and a third lens part,
a surface of the first lens part that extends along the optical axis of the semiconductor laser device is processed into a first inclined surface that is inclined with respect to the optical axis of the semiconductor laser device,
a portion of a surface of the second lens part that extends along the optical axis of the semiconductor laser device and that is formed by the division is processed into a second inclined surface that is parallel to the first inclined surface,
the first lens part is arranged at a position where the first inclined surface approaches closer to the optical axis of the semiconductor laser device as the first inclined surface is more distant from the semiconductor laser device,
the third lens part is arranged, on the optical axis of the semiconductor laser device, at a position more distant from the semiconductor laser device than the first lens part, and
the second lens part is arranged at a position where a surface of the third lens part that extends along the optical axis of the semiconductor laser device and that is opposite to a surface formed by the division and a surface of the second lens part that extends along the optical axis of the semiconductor laser device and that is opposite to a surface formed by the division are brought adjacent to each other.

6. The laser light source device according to claim 2, wherein the optical element has a function of substantially collimating a laser light or a function of a prism.

7. The laser light source device according to claim 3, wherein the optical element has a function of substantially collimating a laser light or a function of a prism.

8. A laser light source device comprising:
a semiconductor laser device that emits an emission light having a divergence angle greater than zero such that the emitted light has a lower-half component light which diverges in a direction towards a substrate and an upper-half component light which diverges in a direction away from the substrate;
an optical element provided on the optical axis of an emission light that is emitted from the semiconductor laser device; and
a sub-mount mounted on the substrate, the sub-mount including
a flat plate insulator member having a flat plate-like shape; and
plurality of metalized patterns provided on an upper surface of the flat plate insulator member, wherein
one of the plurality of metalized patterns is mounted between the substrate and the semiconductor laser device,
the optical element is provided on the upper surface of the flat plate member,
the optical element defines, out of a luminous flux of the emission light emitted from the semiconductor laser device and that is not separated in a fast axis direction, the lower-half emission light is a light that is contained in the emission light from the semiconductor laser device and that has a component diverging toward a side of the flat plate insulator member in the fast axis direction as a first emission light, and the upper-half component light that is contained in the emission light from the semiconductor laser device and that has a component diverging away from the flat plate insulator member in the fast axis direction as a second emission light,
the optical element including a first lens that converts the first emission light into a light that has a component diverging away from the flat plate insulator member with respect to the optical axis producing converted emission light,
the optical element emits light beams parallel to each other by refracting the second emission light and the converted emission light, and
the semiconductor laser device is provided on an upper surface of the sub-mount.

9. The laser light source device according to claim 8, wherein
the optical element has a structure in which lens parts are combined together, the lens parts being obtained by dividing the first lens into two along an optical axis direction of the semiconductor laser device and a direction orthogonal to the optical axis direction of the semiconductor laser device,
one of the lens parts arranged on a side closer to the semiconductor laser device before the division is defined as a first lens part,
the lens parts arranged on a side farther from the semiconductor laser device before the division are defined as a second lens part and a third lens part,
a surface of the first lens part that extends along the optical axis of the semiconductor laser device is processed into a first inclined surface that is inclined with respect to the optical axis of the semiconductor laser device,
a portion of a surface of the second lens part that extends along the optical axis of the semiconductor laser device and that is formed by the division is processed into a second inclined surface that is parallel to the first inclined surface,
the first lens part is arranged at a position where the first inclined surface approaches closer to the optical axis of the semiconductor laser device as the first inclined surface is more distant from the semiconductor laser device,
the third lens part is arranged, on the optical axis of the semiconductor laser device, at a position more distant from the semiconductor laser device than the first lens part, and
the second lens part is arranged at a position where a surface of the third lens part that extends along the optical axis of the semiconductor laser device and that is opposite to a surface formed by the division and a surface of the second lens part that extends along the optical axis of the semiconductor laser device and that is opposite to a surface formed by the division are brought adjacent to each other.

10. The laser light source device according to claim 8, wherein the optical element has a function of substantially collimating a laser light or a function of a prism.

* * * * *